United States Patent
Cheng et al.

(10) Patent No.: US 11,882,772 B2
(45) Date of Patent: Jan. 23, 2024

(54) CONDUCTIVE-BRIDGING SEMICONDUCTOR MEMORY DEVICE FORMED BY SELECTIVE DEPOSITION

(71) Applicant: International Business Machines Corporation, Armonk, NY (US)

(72) Inventors: Kangguo Cheng, Schenectady, NY (US); Chanro Park, Clifton Park, NY (US); Julien Frougier, Albany, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 255 days.

(21) Appl. No.: 17/460,504

(22) Filed: Aug. 30, 2021

(65) Prior Publication Data

US 2023/0068851 A1    Mar. 2, 2023

(51) Int. Cl.
  *H10N 70/00*   (2023.01)
  *H10B 63/00*   (2023.01)
  *H10N 70/20*   (2023.01)

(52) U.S. Cl.
  CPC ......... *H10N 70/011* (2023.02); *H10B 63/00* (2023.02); *H10N 70/245* (2023.02); *H10N 70/8416* (2023.02)

(58) Field of Classification Search
  CPC .............. H10N 70/011; H10N 70/245; H10N 70/8416; H10B 63/00
  See application file for complete search history.

(56) References Cited

U.S. PATENT DOCUMENTS

| | | | |
|---|---|---|---|
| 8,269,204 B2 | 9/2012 | Greene | |
| 8,617,959 B2 | 12/2013 | Sandhu | |
| 9,530,493 B2 | 12/2016 | Eleftheriou | |
| 9,773,842 B2 | 9/2017 | Tso-Hua | |
| 9,978,938 B2 | 5/2018 | Trinh | |
| 10,868,246 B2 | 12/2020 | Karpov | |
| 2013/0099189 A1* | 4/2013 | Sandhu | H10N 70/245 |
| | | | 438/381 |
| 2015/0263277 A1* | 9/2015 | Ozawa | H10N 70/8416 |
| | | | 257/5 |
| 2018/0287061 A1* | 10/2018 | Ando | H10N 70/8833 |
| 2020/0328346 A1 | 10/2020 | Kong | |

FOREIGN PATENT DOCUMENTS

WO    2017111930 A1    6/2017

OTHER PUBLICATIONS

Choi et al., "SiGe epitaxial memory for neuromorphic computing with reproducible high performance based on engineered dislocations", nature materials, vol. 17, Apr. 2018, pp. 335-340, <https://doi.org/10.1038/s41563-017-0001-5>.

Kamaladasa et al., "Dislocation impact on resistive switching in single-crystal SrTiO3", Journal of Applied Physics 113, 234510 (2013), <http://dx.doi.org/10.1063/1.4811525>, Received Apr. 14, 2013; accepted Jun. 4, 2013; published online Jun. 21, 2013, 8 pages.

* cited by examiner

*Primary Examiner* — Jerome Leboeuf

(74) *Attorney, Agent, or Firm* — Aaron Pontikos

(57) ABSTRACT

A memory cell and formation thereof. The memory cell including: a first dielectric material having a via; a dielectric spacer on a sidewall of the via, and a second dielectric material pinching off the via and forming a seam.

17 Claims, 12 Drawing Sheets

US 11,882,772 B2

CONDUCTIVE-BRIDGING SEMICONDUCTOR MEMORY DEVICE FORMED BY SELECTIVE DEPOSITION

BACKGROUND OF THE INVENTION

The present invention relates generally to the field of non-volatile semiconductor memory devices, and more particularly to forming a conductive-bridging random access memory (CBRAM) semiconductor memory device via selective deposition.

Non-volatile memory (NVM) or non-volatile storage is a type of computer memory that can retain stored information even after power is removed. Unlike volatile memory, NVM does not require its memory data to be periodically refreshed. NVM is commonly used for secondary storage or long-term consistent storage. Examples of NVM include most types of magnetic computer storage devices (e.g., hard disk drives, floppy disks, and magnetic tape) flash memory, read-only memory (ROM), ferroelectric random-access memory FRAM, resistive RAM (ReRAM or RRAM), and conductive-bridging RAM (CBRAM).

ReRAM is a type of non-volatile (NV) RAM computer memory that works by changing the resistance across a dielectric solid-state material. ReRAM cells work on the principle of reversible switching of certain high resistivity dielectrics between a conductive and a more resistant state. CBRAM cells work on the principle of a reversible creation of an electrochemically induced nanoscale conductive link in a special dielectric acting as an ionic conductor. The data in the CBRAM cells are stored in the form of the resistance value of the dielectric. High resistance data implies logic data "0" and low resistance implies logic data "1." The CBRAM cells can be switched back and forth between these two resistance values upon application of a short voltage pulse across them. The process of writing "1" and "0's" in CBRAM cells is very fast (10's to 100's of nanoseconds), and utilizes a far smaller amount of power than other non-volatile semiconductor technologies.

SUMMARY

According to one embodiment of the present invention, a memory cell is provided. The memory cell includes: a first dielectric layer; a dielectric spacer on a sidewall of the via; and a second dielectric material pinching off the via and forming a seam.

According to another embodiment of the present invention, a method of forming a memory cell is provided. The method includes: forming a seam in a via that is directly connected to a first electrode based on pinching off the via, wherein pinching off the via includes selectively depositing a dielectric material on top of a dielectric spacer formed within the via.

BRIEF DESCRIPTION OF THE SEVERAL VIEWS OF THE DRAWINGS

The following detailed description, given by way of example and not intend to limit the disclosure solely thereto, will best be appreciated in conjunction with the accompanying drawings, in which:

When viewed as ordered combinations, FIGS. 1-13 illustrate both (i) conductive-bridging semiconductor memory devices and (ii) the methods for forming such conductive-bridging semiconductor memory devices, in accordance with illustrative embodiments.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
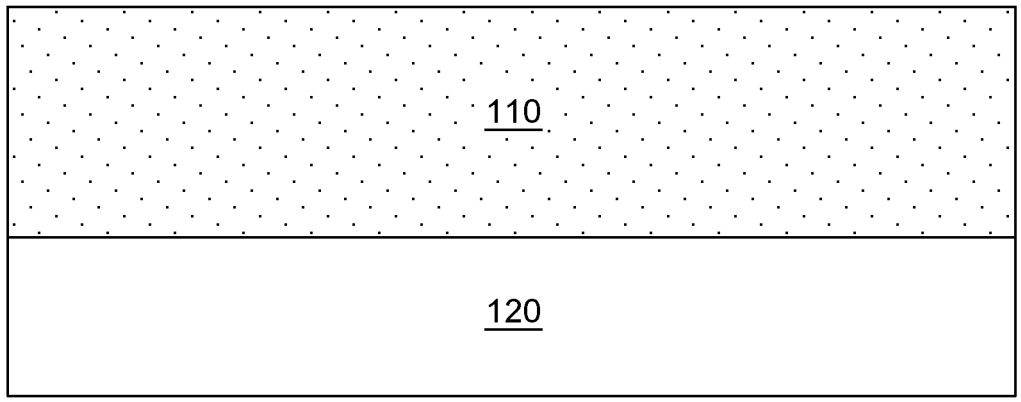
FIG. 1 illustrates a cross-sectional view depicting formation of a dielectric layer 110 on top of a substrate 120 in accordance with at least one embodiment of the present invention.

Embodiments of the present invention provide for a ReRAM semiconductor memory device and methods of forming a ReRAM semiconductor memory device via selective deposition.

Embodiments of the present invention recognize that, depending on the physical connection of nano-sized filament(s) between the top and bottom electrodes of a ReRAM cell, the conductance (or resistance) of the ReRAM cell changes. Embodiments of the present invention recognize that current methods of forming ReRAM cells are prone to large cell-to-cell variation between cells. This stems from the fact that is extremely challenging, and potentially impossible, to precisely place a filament(s) between the top and bottom electrodes when forming a ReRAM cell. Accordingly, embodiments of the present invention recognize the need for a ReRAM semiconductor memory device and methods for forming ReRAM semiconductor memory devices having a conductive filament placed at a consistent, and uniform predetermined position.

Embodiments of the present invention provide for a ReRAM semiconductor memory device, and methods for forming a ReRAM semiconductor device having conductive filaments that are consistent in size, and that are uniformly located at predetermined positions to form a conductive bridge between a top and bottom electrode. In an embodiment, a via is formed on top of a bottom electrode. A dielectric spacer is then formed on the sidewall of the via. A dielectric material is then selectively deposited on top of the surfaces of the dielectric spacer to pinch off the via, thereby resulting in a seam that extends downward, and that is connected to, the bottom electrode. In an embodiment, the position of the seam within the via is determined by an atomic layer deposition (ALD) pinch-off point formed from the selective deposition of the dielectric material onto the dielectric spacer. It should be appreciated that as long as the thickness of the dielectric material deposited onto the dielectric spacer is equal to or greater than half the diameter of the via, the location of the seam will remain uniform irrespective of the diameter of the via.

In an embodiment, a conductive material, such as silver (Ag) is then diffused along the seam to form a conductive filament. It should be appreciated that since the seam is formed by pinching off the via by means of selective dielectric deposition of a dielectric material onto the dielectric spacer, the resulting seam formed within the via will remain connected to the bottom electrode. This allows for the conductive material diffused along the seam to reach the bottom electrode, thereby connecting the conductive filament formed within the seam to the bottom electrode. A top electrode is then formed on top of the seam, thereby forming a conductive bridge between the top bottom and top electrodes.

Accordingly, compared to current ReRAM semiconductor memory devices, and methods of forming thereof, embodiments of the present invention provide for improved uniformity in the position of conductive filament(s) formed between the top and bottom electrodes of ReRAM cells. This improved uniformity in the position of the conductive filament(s) reduces, if not eliminates, any cell-to-cell variation (i.e., patterning variations) between ReRAM cells, which ultimately results in uniform conductance (or resistance) properties amongst ReRAM cells of a semiconductor memory device.

Exemplary embodiments now will be described more fully herein with reference to the accompanying drawings, in which exemplary embodiments are shown. In the following detailed description, numerous specific details are set forth in order to provide a thorough understanding of various embodiments of the invention. However, it is to be understood that embodiments of the invention may be practiced without these specific details. As such, this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

As described below, in conjunction with FIGS. 1-13, embodiments may include semiconductor memory devices and methods of forming a semiconductor memory device, and in particular, a CBRAM semiconductor memory device via selective deposition of a dielectric material on top of a dielectric material. The methods described below in conjunction with FIGS. 1-13 may be incorporated into typical semiconductor fabrication processes, such as fabrication processes. As such, when viewed as ordered combinations, FIGS. 1-13 illustrate methods for forming semiconductor memory devices via selective deposition, in accordance with illustrative embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is focused on the distinctive features or elements of various embodiments of the present invention.

As used herein, semiconductor structures refer to one or more physical structures that comprise semiconductor memory devices.

As used herein, terms such as "depositing," "forming," and the like may refer to the disposition of layers, or portions of materials, in accordance with a given embodiment. Such processes may or may not be different than those used in the standard practice of the art of semiconductor memory device fabrication. Such processes include, but are not limited to, atomic layer deposition (ALD), molecular layer deposition (MLD), chemical vapor deposition (CVD), low-pressure chemical vapor deposition (LPCVD), plasma enhanced chemical vapor deposition (PECVD), limited reaction processing CVD (LRPCVD), ultrahigh vacuum chemical vapor deposition (UHVCVD), metalorganic chemical vapor deposition (MOCVD), physical vapor deposition, sputtering, plating, evaporation, ion beam deposition, electron beam deposition, laser assisted deposition, chemical solution deposition, or any combination of those methods.

As used herein, terms, such as "forming," and the like, may refer to processes that alter the structure and/or composition of one or more layers of material or portions of materials in accordance with a given embodiment. For example, such formation processes may include, but are not limited to, exposure to a specific frequency or range of frequencies of electromagnetic radiation, ion implantation techniques, and/or chemical/mechanical polishing (CMP). As used herein, terms, such as "forming," and the like, may refer to processes that alter the structure of one or more layers of material, or portions of material(s), by removal of a quantity of material, in accordance with a given embodiment. For example, such formation processes may include, but are not limited to, wet and/or dry etching processes, plasma etching processes, or any of the known etching processes in which material is removed.

Those skilled in the art understand that many different techniques may be used to add, remove, and/or alter various materials, and portions thereof, and that embodiments of the present invention may leverage combinations of such processes to produce the structures disclosed herein without deviating from the scope of the present invention.

The present invention will now be described in detail with reference to the Figures. FIGS. 1-13 include various perspective views and cross-sectional views depicting illustrative steps of a method for manufacturing ReRAM semiconductor memory devices and the resulting ReRAM semiconductor memory devices according to select embodiments of the present invention. One having ordinary skill in the art will appreciate that there are many options available for the formation of the structures described herein and that the following discussion does not limit embodiments to only the techniques described herein.

Referring now to FIG. 1, FIG. 1 illustrates a cross-sectional view depicting formation of a dielectric layer 110 on top of a substrate 120. In an embodiment, dielectric layer 110 is formed on top of substrate 120 via any generally known methods, such as atomic layer deposition or chemical vapor deposition. In an embodiment, dielectric layer 110 can be, for example, a low-k dielectric or an oxide dielectric, such as silicon oxide. In an embodiment, dielectric layer 110 can be, for example, a nitride dielectric, such as silicon nitride. In an embodiment, substrate 120 can be made from any generally known semiconductor materials, such as silicon, gallium arsenide, or germanium. However, embodiments of the present invention are not limited to a particular type of semiconductor material or dielectric material. In an embodiment, substrate 120 can include other devices and structures (not shown), including but not limited to, transistors, diodes, capacitors, wires, interconnects, isolations, etc.

Figure 2:
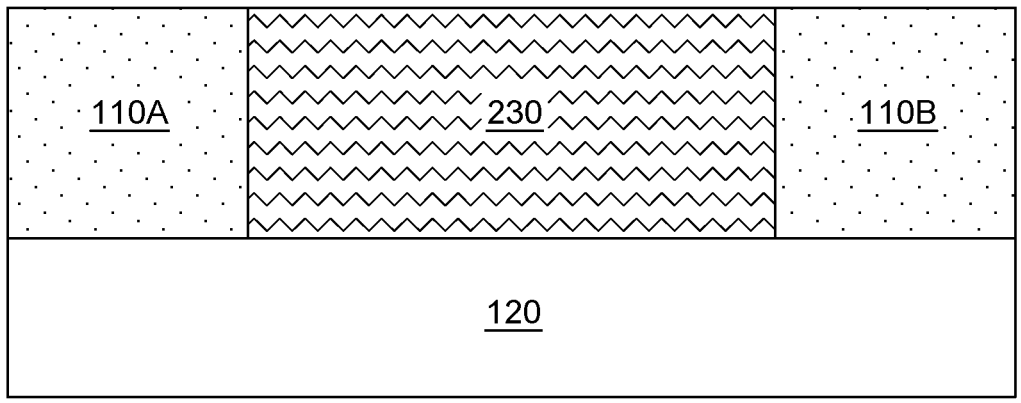
FIG. 2 illustrates a cross-sectional view of the structure depicted in FIG. 1 after subsequent processing steps in accordance with at least one embodiment of the present invention.

Referring now to FIG. 2, FIG. 2 illustrates a cross-sectional view of the structure depicted in FIG. 1 after subsequent processing steps. As depicted in FIG. 2, bottom electrode 230 is formed on top of substrate 120 and in between dielectric layer 110A and dielectric layer 110B of dielectric layer 110 (depicted in FIG. 1). As further depicted in FIG. 2, bottom electrode 230 abuts the left and right sides of dielectric layer 110A and dielectric layer 110B, respectively. In an embodiment, the structure as depicted in FIG. 2 is achieved by removing a portion of dielectric layer 110 (depicted in FIG. 1) and forming (e.g., via chemical vapor deposition or plating or any other suitable deposition techniques) bottom electrode 230 on top of substrate 120 and within the removed portion of dielectric layer 110. In an embodiment, bottom electrode 230 can be, for example, tungsten or platinum. However, embodiments of the present invention are not limited to a particular type of electrode. In an embodiment, bottom electrode 230 can be formed from a single conductive material or a combination of multiple conductive materials.

Figure 3:
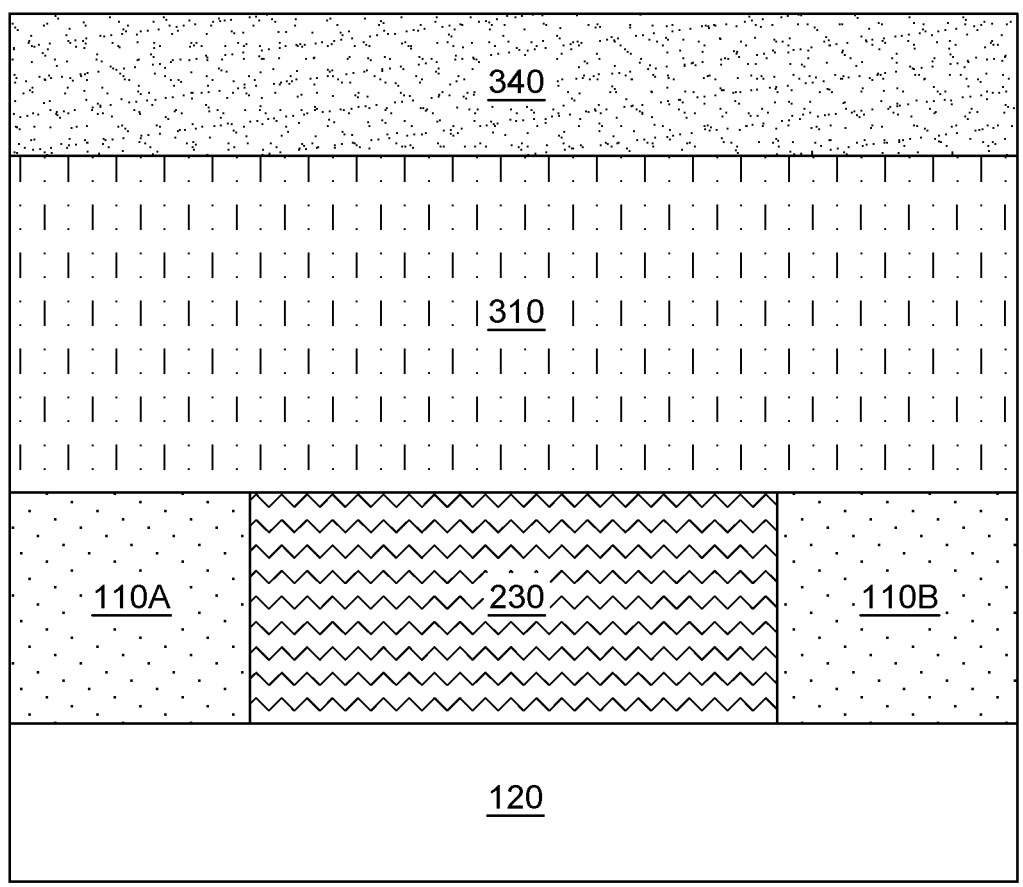
FIG. 3 illustrates a cross-sectional view of the structure depicted in FIG. 2 after subsequent processing steps in accordance with at least one embodiment of the present invention.

FIG. 3 illustrates a cross-sectional view of the structure depicted in FIG. 2 after subsequent processing steps. As depicted in FIG. 3, dielectric layer 310 is formed (e.g., via atomic layer deposition, chemical vapor deposition, or any other suitable deposition techniques) on top of bottom electrode 230 and on top of dielectric layers 110A and 110B. In an embodiment, dielectric layer 310 can be, for example, a low-k dielectric or an oxide dielectric, such as silicon oxide. In an embodiment, dielectric layer 310 can be, for example, a nitride dielectric, such as silicon nitride. In an optional embodiment, a metallic layer 340 is formed on top of dielectric layer 310. In an embodiment, metallic layer 340 is a metallic material, such as titanium nitride (TiN).

Figure 4:
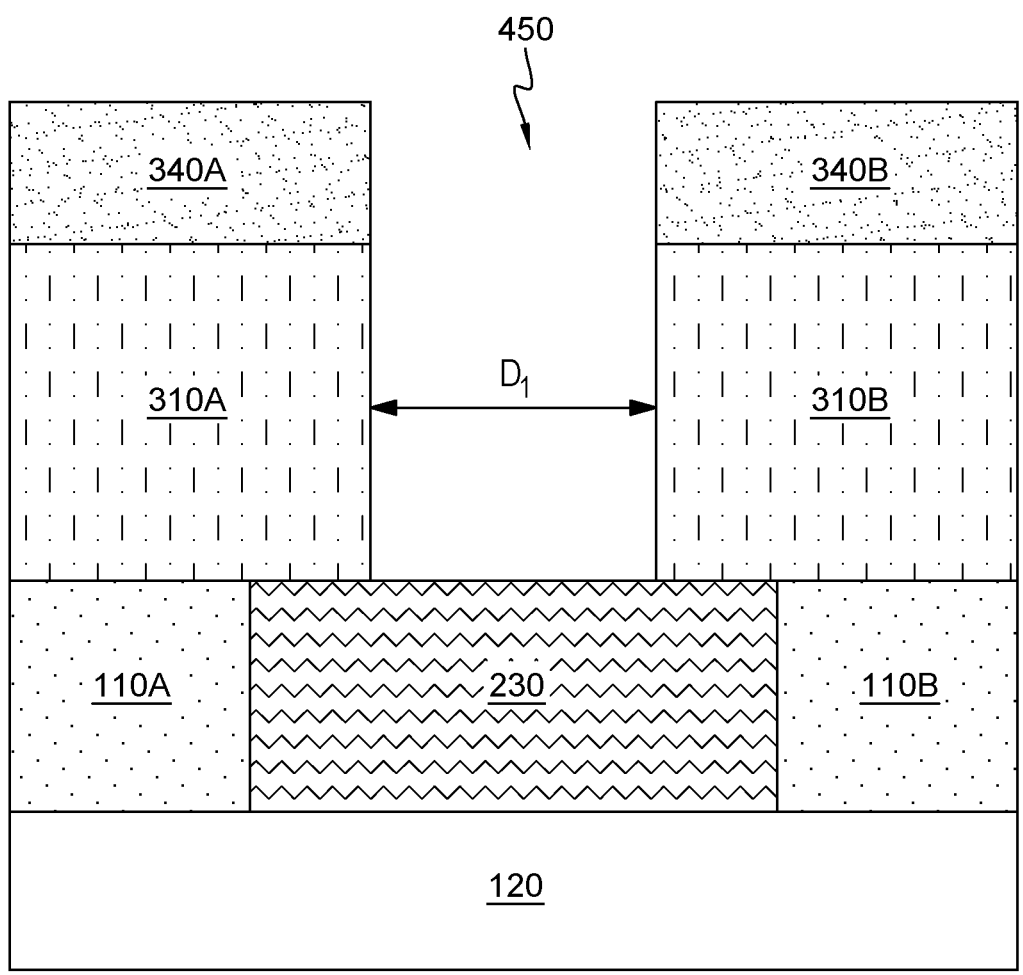
FIG. 4 illustrates a cross-sectional view of the structure depicted in FIG. 3 after subsequent processing steps in accordance with at least one embodiment of the present invention.

FIG. 4 illustrates a cross-sectional view of the structure depicted in FIG. 3 after subsequent processing steps. As depicted in FIG. 4, a via 450 having a diameter ($D_1$) is formed in between dielectric layers 310A and 310B of dielectric layer 310 (depicted in FIG. 3), in between metallic layers 340A and 340B of metallic layer 340 (depicted in FIG. 3), and adjacent to electrode 230. In an embodiment, via 450 is formed by removing (e.g., masking and etching) portions of dielectric layer 310 and metallic layer 340 (in those instances in which metallic layer 340 is formed on top of dielectric layers 310 and 310B) to form the structure as depicted in FIG. 4. In an embodiment, the diameter ($D_1$) of via 450 is approximately 40 nanometers (nm). However, embodiments of the present invention are not limited to a particular via size. Accordingly, embodiments of the present invention may be practiced utilizing vias having a diameter ($D_1$) that is wider than or narrower than 40 nm.

As further depicted in FIG. 4, via 450 includes a sidewall formed by dielectric layer 310 and metallic layer 340. As depicted in FIG. 4, metallic layers 340A and 340B have optionally been deposited on top of dielectric layers 310A and 310B, respectively. However, if metallic layers 340A and 340B were not optionally deposited on top of dielectric layers 310A and 310B, the sidewall of via 450 would be formed entirely from dielectric layers 310A and 310B, respectively.

Figure 5:
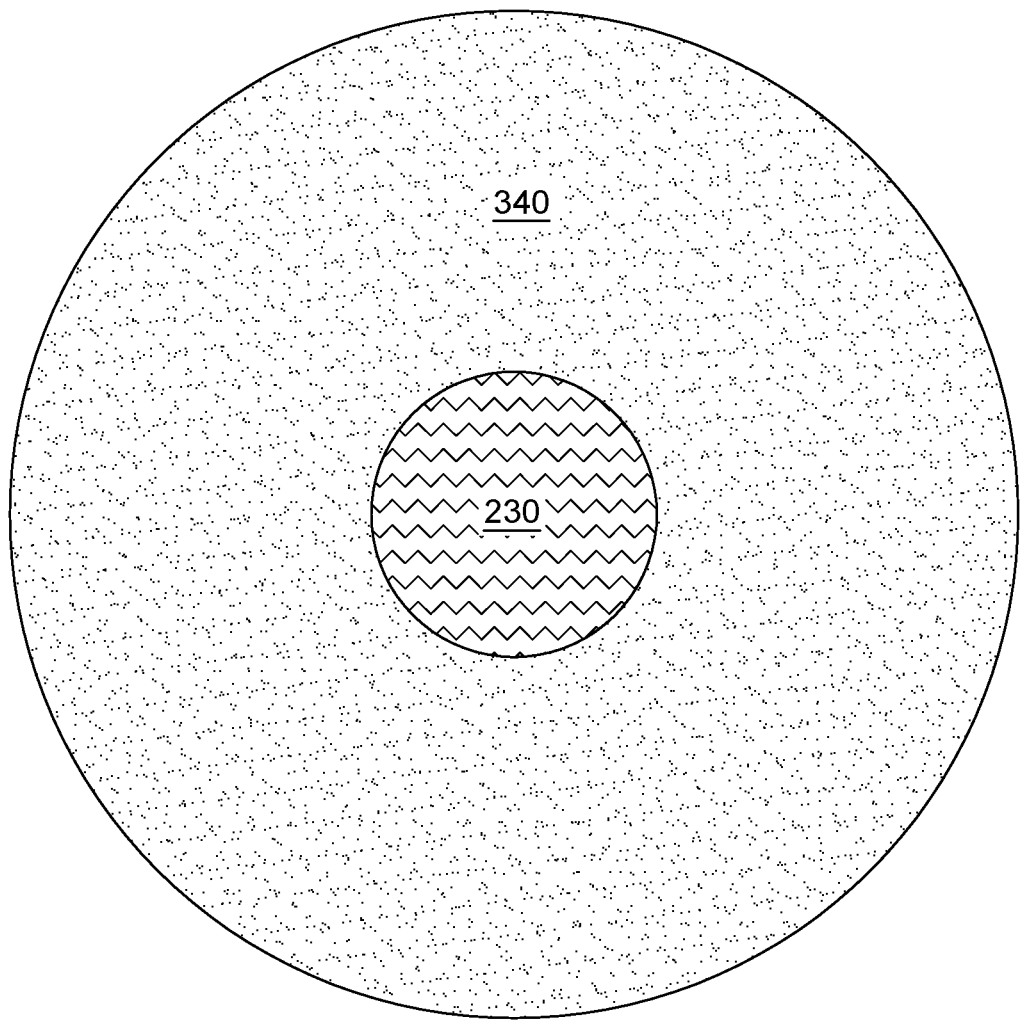
FIG. 5 illustrates a top-down view of the structure depicted in FIG. 4 in accordance with at least one embodiment of the present invention.

FIG. 5 illustrates a top-down view of the structure depicted in FIG. 4 in accordance with at least one embodiment of the present invention. As depicted in FIG. 5, metallic layer 340 has been deposited on top of dielectric layer 310, and as a result, dielectric layer 310 is not visible. Looking down through via 450 (not depicted), the top surface of bottom electrode 230 can be seen.

Figure 6:
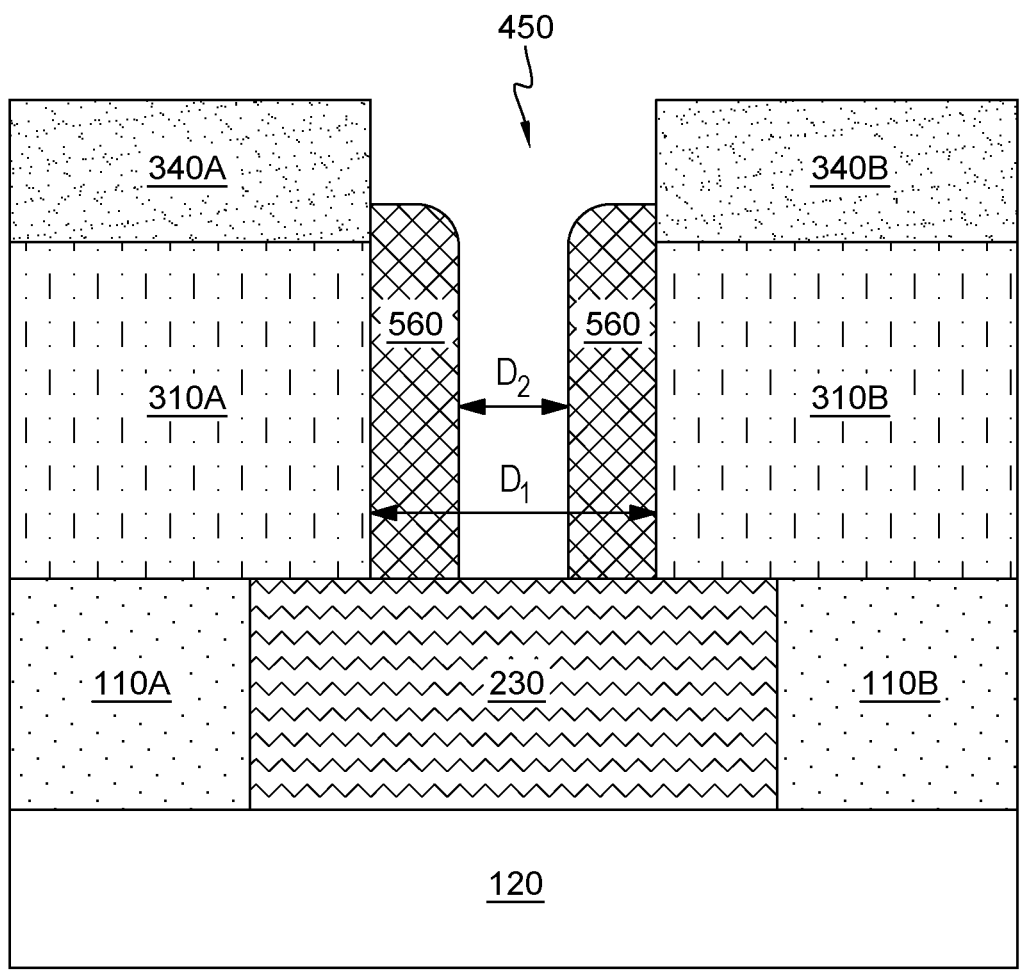
FIG. 6 illustrates a cross-sectional view of the structure depicted in FIG. 4 after subsequent processing steps in accordance with at least one embodiment of the present invention.

FIG. 6 illustrates a cross-sectional view of the structure depicted in FIG. 4 after subsequent processing steps. As depicted in FIG. 6, a dielectric spacer 560 is formed within via 450. Specifically, dielectric spacer 560 is formed on top of a portion of bottom electrode 230, along the right and left sides of dielectric layers 310A and 310B, respectively, and along a portion of the right and left sides of metallic layers 340A and 340B, respectively. In an embodiment, dielectric spacer 560 can be, for example, a nitride dielectric, such as silicon nitride. However, in embodiments of the present invention, dielectric spacer 560 is not limited to a particular type of dielectric material.

Dielectric spacer 560 may be formed via any generally known deposition processes (e.g., chemical vapor deposition, atomic layer deposition, or any other suitable deposition techniques), followed by at least one of directional etching (e.g., reactive ion etch (RIE)) and over etching (e.g., RIE over etch) to reduce the diameter ($D_1$) for a portion of via 450 to the diameter ($D_2$) as depicted in FIG. 5. In an embodiment, the diameter ($D_2$) of the portion of via 450 is approximately 15 nanometers (nm). However, embodiments of the present invention are not limited to a particular diameter ($D_2$) of via 450 so long as the diameter ($D_2$) of the portion of via 450 is greater than zero. In other words, a space or gap must remain in between dielectric spacer 560 such that selective deposition of dielectric material 610 (depicted and further discussed below with reference to FIG. 8) can be performed on dielectric spacer 560.

Figure 7:
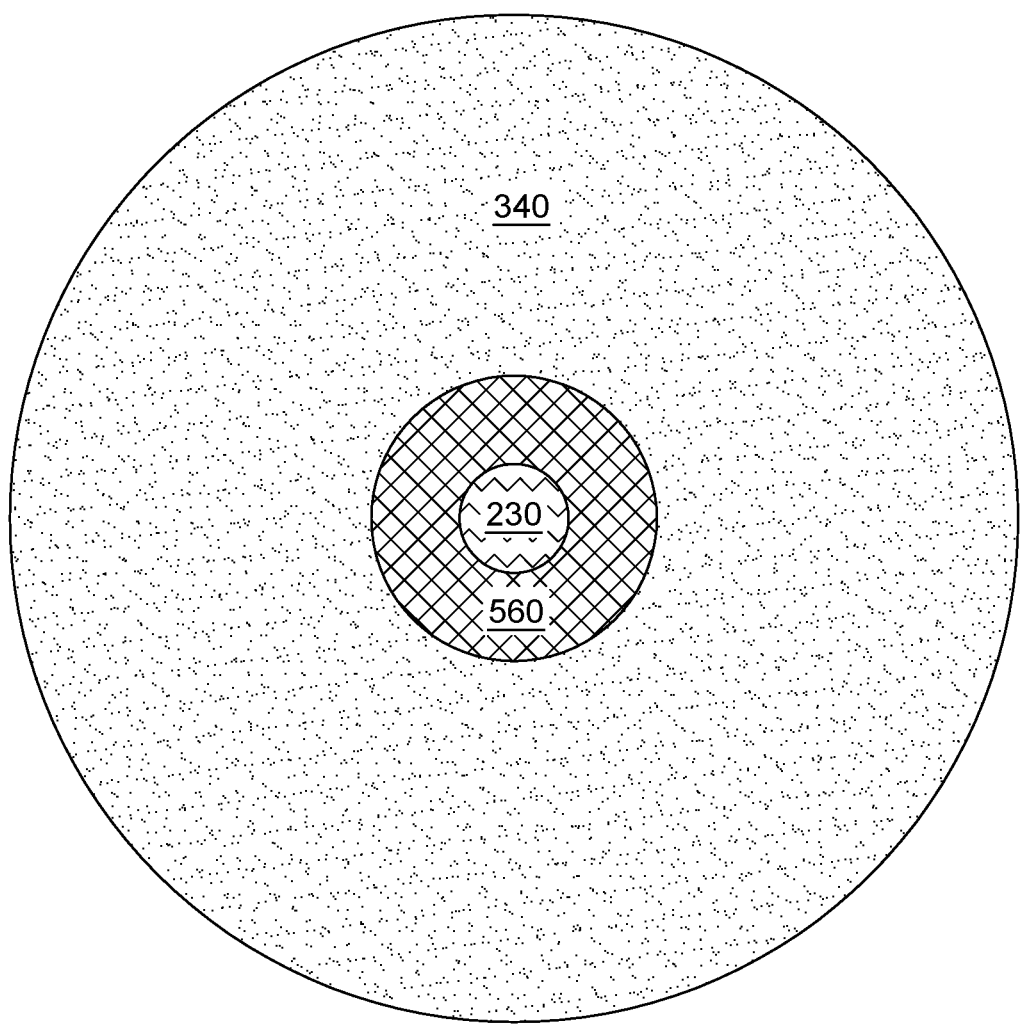
FIG. 7 illustrates a top-down view of the structure depicted in FIG. 6 in accordance with at least one embodiment of the present invention.

FIG. 7 illustrates a top-down view of the structure depicted in FIG. 6 in accordance with at least one embodiment of the present invention. As depicted in FIG. 7, metallic layer 340 has been deposited on top of dielectric layer 310, and as a result, dielectric layer 310 is not visible. As further depicted in FIG. 7, dielectric spacer 560 is formed within via 450 (not depicted). Looking down through via 450 (not depicted), and as compared to the diameter of bottom electrode 230 in FIG. 5, the diameter of bottom electrode 230 in FIG. 7 is smaller, but still visible after formation of dielectric spacer 560 within via 450 (not depicted).

Figure 8:
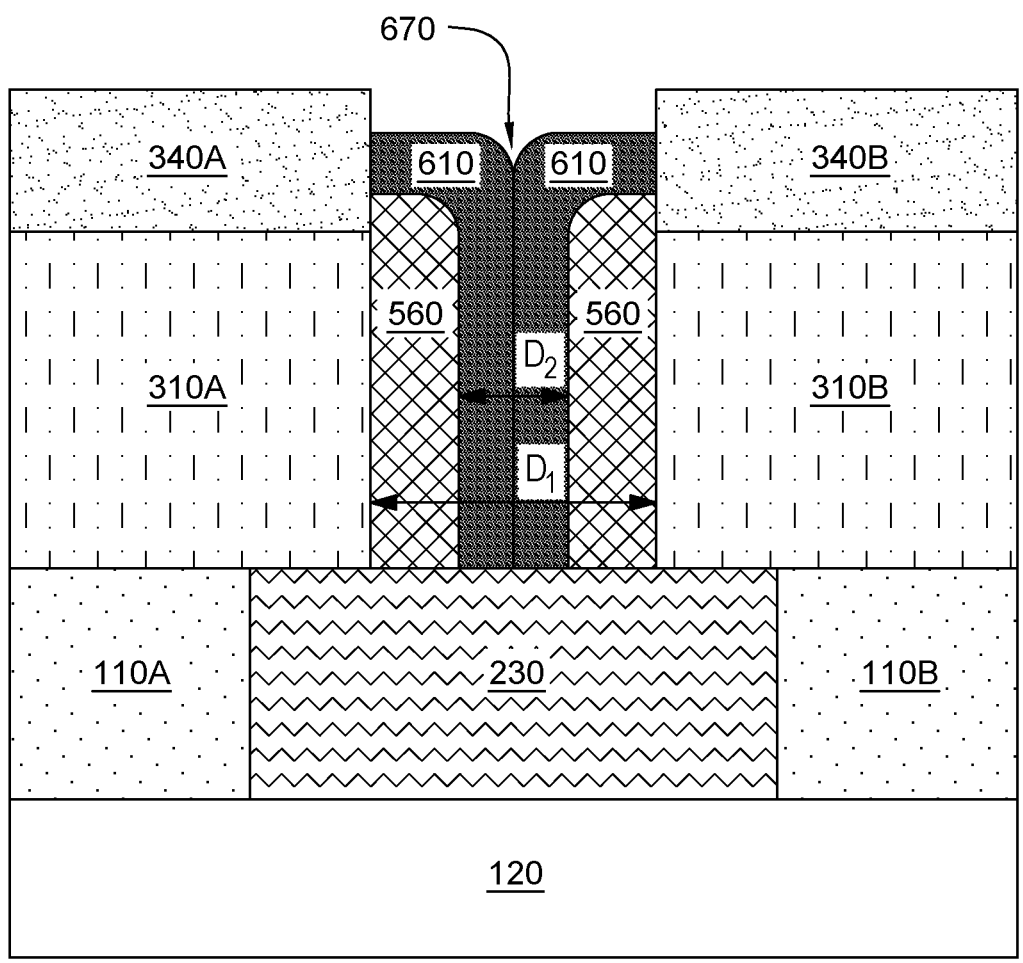
FIG. 8 illustrates a cross-sectional view of the structure depicted in FIG. 6 after subsequent processing steps in accordance with at least one embodiment of the present invention.

FIG. 8 illustrates a cross-sectional view of the structure as depicted in FIG. 6 after subsequent processing steps. Specifically, FIG. 8 depicts the structure of FIG. 6 after selective dielectric deposition of dielectric layer 610 onto dielectric spacer 560. In an embodiment, dielectric layer 610 is formed based on performing area selective deposition (e.g., area selective atomic layer deposition) of a dielectric material onto dielectric spacer 560. In an embodiment, the selective deposition of a dielectric material onto spacer 560 is conformal. In other words, the dielectric material selectively deposited onto dielectric spacer 560 conforms to the contours of dielectric spacer 560.

It should be appreciated that if metallic layers 340A and 340B are optionally deposited onto dielectric layers 310A and 310B, deposition of dielectric layer 610 will not form on the surfaces of metallic layers 340A and 340B since metallic layers 340A and 340B are conductive. It should further be appreciated that since dielectric layer 610 is selectively deposited onto dielectric spacer 560, dielectric layer 610 will not form along the entire surface of bottom electrode 230, and thus, seam 670 is formed such that seam 670 is connected to bottom electrode 230. This is extremely important, as formation of dielectric material layer 610 along the entire surface of bottom electrode 230 would cut off the seam from bottom electrode 230, thereby preventing the formation of a conductive filament 780 (discussed below with reference to FIG. 10) within seam 670 that is connected to bottom electrode 230.

As further depicted in FIG. 8, performing the selective deposition of dielectric layer 610 onto dielectric spacer 560 results in a pinch off of via 450, and thereby the formation of a seam 670 in dielectric layer 610. In an embodiment, seam 670 is one dimensional (1D). In an embodiment, seam 670 is centrally located between dielectric spacer 560.

It should be appreciated that as long as the pinch of thickness of the dielectric material selectively deposited onto dielectric spacer 560 is equal to or greater than half the diameter ($D_1$) of via 450, the location of the seam will remain uniform irrespective of the diameter ($D_1$). For example, if the diameter ($D_2$) of the portion of via 450 is approximately 15 nanometers (nm), approximately 7.5 nanometers (nm) of dielectric layer 610 is required to be selectively deposited onto dielectric spacer 560 in order to pinch off via 550, and thereby form seam 670.

Figure 9:
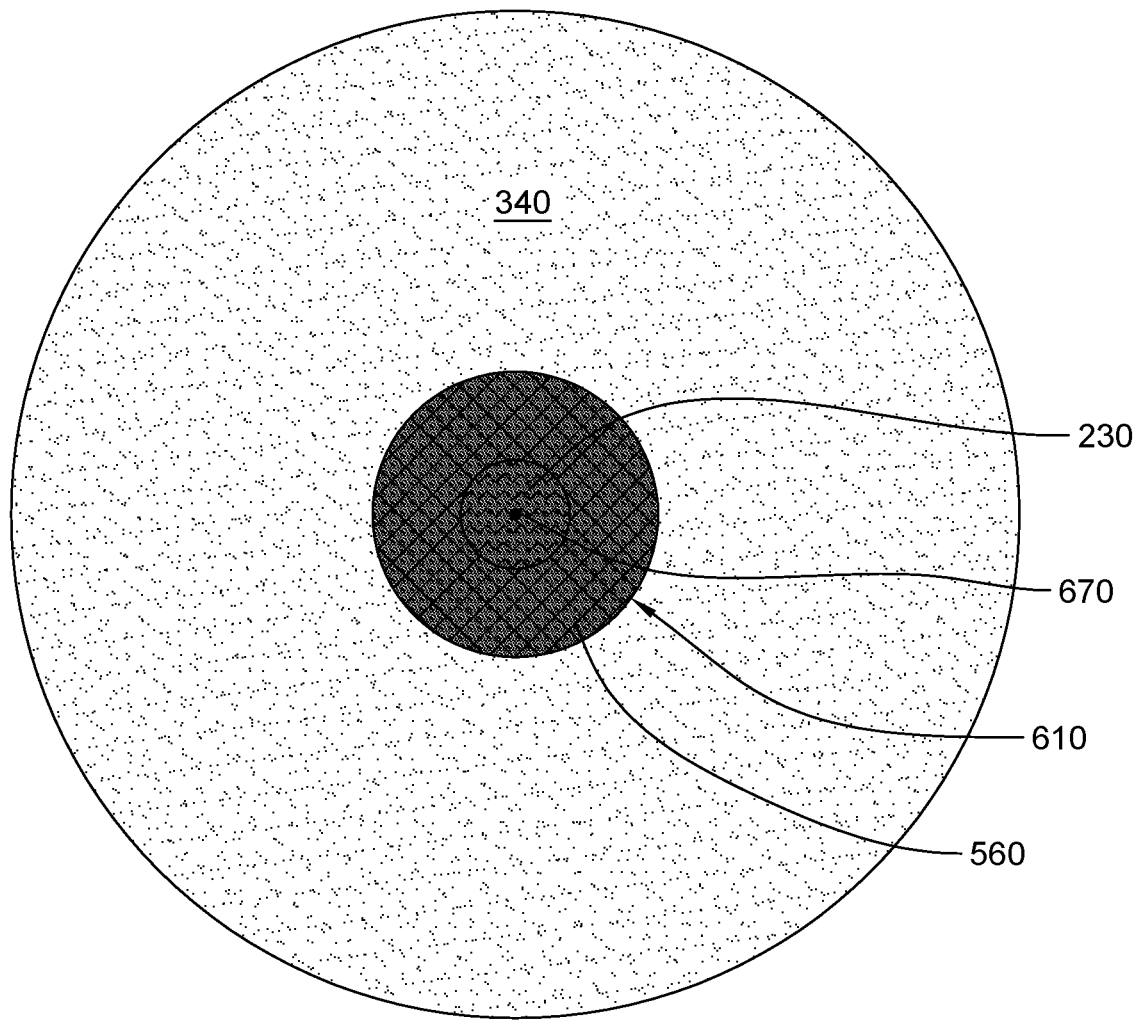
FIG. 9 illustrates a top-down view of the structure depicted in FIG. 8 in accordance with at least one embodiment of the present invention.

FIG. 9 illustrates a top-down view of the structure as depicted in FIG. 8 in accordance with at least one embodiment of the present invention. As depicted in FIG. 9, metallic layer 340 has been deposited on top of dielectric layer 310, and as a result, dielectric layer 310 is not visible. As further depicted in FIG. 7, dielectric layer 610 has been selectively deposited onto spacer 560, resulting in a pinch-off of via 450 (not depicted) and the formation of seam 670 connected to bottom electrode 230. It should be appreciated that dielectric spacer 560 and bottom electrode 230 only remain visible in FIG. 9 for illustrative purposes, and that in actual practice, dielectric spacer 560 and bottom electrode 230 would not be visible from a top-down view of the structure as depicted in FIG. 8.

Figure 10:
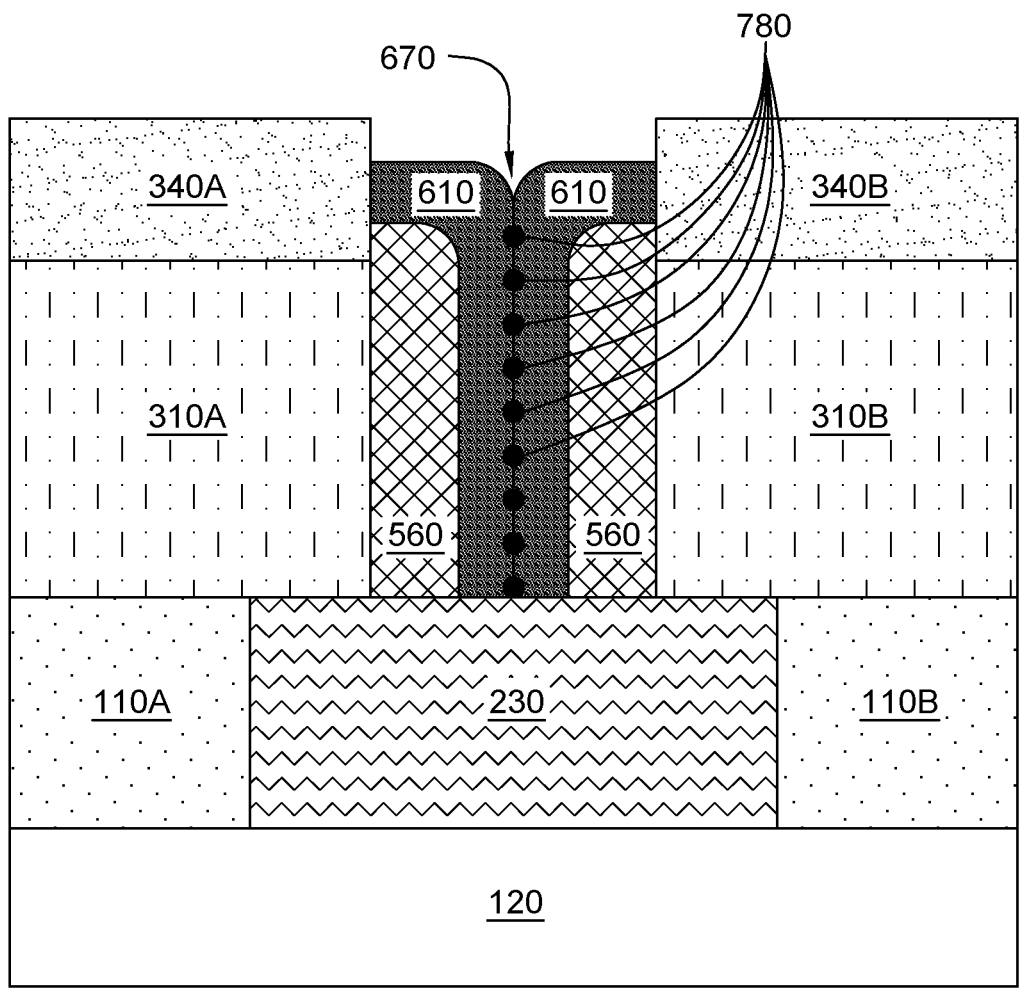
FIG. 10 illustrates a cross-sectional view of the structure depicted in FIG. 8 after subsequent processing steps in accordance with at least one embodiment of the present invention.

FIG. 10 illustrates a cross-sectional view of the structure as depicted in FIG. 8 after subsequent processing steps. Specifically, FIG. 10 depicts a conductive filament 780 formed on top of dielectric layer 610 and within seam 670. Conductive filament 780 forms a conductive pathway in seam 670 that is connected to the top surface of bottom electrode 230. Specially, conductive filament 780 can be formed in seam 670 such that an end of conductive filament 780 within seam 670 is connected to the top surface of bottom electrode 230. In an embodiment, conductive filament 780 is a metallic material, such as silver (Ag), gold (Au), copper (Cu), ruthenium (Ru), cobalt (Co), nickel (Ni), or tungsten (W). However, embodiments of the present invention are not limited to any particular conductive filament. In an embodiment, formation of conductive filament 780 within seam 670 can be combined with the formation of a top electrode 830 (depicted and described in further detail below with respect to FIG. 11) formed on top of metallic layers 340A and 340B. In an embodiment, conductive filament 780 is formed by depositing a metallic material followed by a thermal annealing. For example, the thermal annealing can be a furnace anneal, rapid thermal anneal, flash anneal, or laser anneal. In an embodiment, for furnace anneal and rapid thermal anneal, the annealing temperature can range from 150° C. to 450° C. for furnace anneal and rapid thermal anneal and the anneal duration can range from 10 minutes to one hour. In an embodiment, for flash anneal/laser anneal, the annealing temperature can be higher (e.g., from 450° C. to 1000° C.), but the anneal duration is much shorter (e.g., ranging from 100 nanoseconds to 100 milliseconds). It should be appreciated that since the metallic species in the metallic material diffuses much faster (e.g., 10 to 100 times faster) along the seam than through dielectric layer 610, conductive filament 780 is formed along the seam.

Conductive filament 780 can be formed on top of dielectric layer 610 and within seam 670 based on any generally known methods, including spin-coating, spray, sputtering, atomic layer deposition, chemical vapor deposition, and condensation. In an embodiment, conductive filament 780 can be heated (e.g., via thermal annealing) after it is formed on top of dielectric layer 610 and within seam 670.

Figure 11:
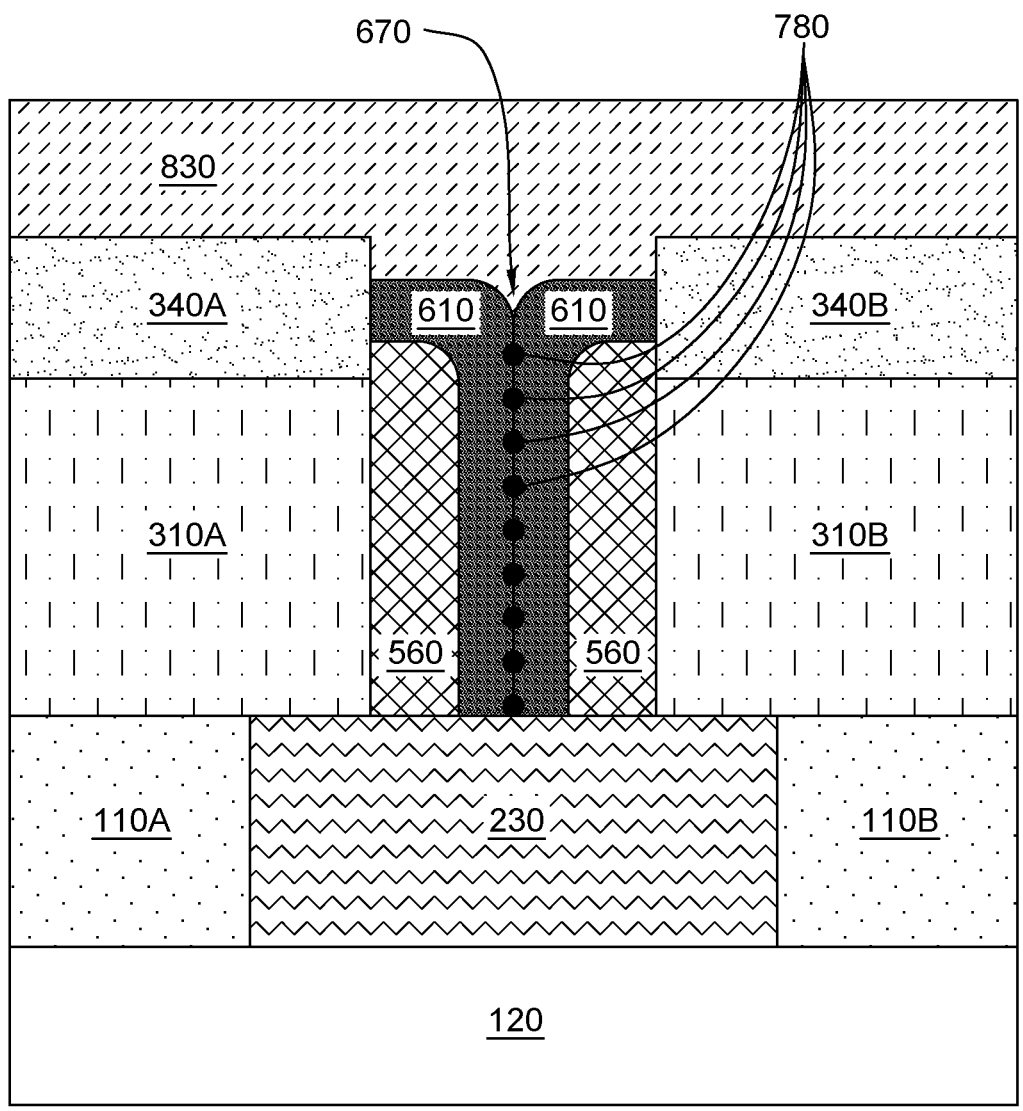
FIG. 11 illustrates a cross-sectional view of the structure depicted in FIG. 10 after subsequent processing steps in accordance with at least one embodiment of the present invention.

FIG. 11 illustrates a cross-sectional view of the structure as depicted in FIG. 10 after subsequent processing steps. Specifically, FIG. 11 depicts a top electrode 830 formed (e.g., via atomic layer deposition) on top of dielectric layer 610, seam 670, and a portion of metallic layers 340A and 340B. As depicted in FIG. 11, a bottom portion of conductive filament 780 is connected to the top surface of bottom electrode 230 and a top portion of conductive filament 780 is connected to the bottom surface of top electrode 830. Accordingly, conductive filament 780 forms a conductive pathway in seam 670 between bottom electrode 230 and top electrode 830. In an embodiment, conductive filament 780 and top electrode 830 are formed from the same metallic material. In an alternative embodiment, conductive filament 780 and top electrode 830 are formed from different metallic materials.

It should be appreciated that conductive filament 780 is depicted as balls of filament for illustrative purposes only, in order to show a metallic material being diffused through the seam to form conductive filament 780. However, in embodiments of the present invention, conductive filament 780 is a conductive thread, strand, or string of metallic material that forms a conductive pathway within seam 670 that connects the top surface of bottom electrode 230 and the bottom surface of top electrode 830.

Figure 12:
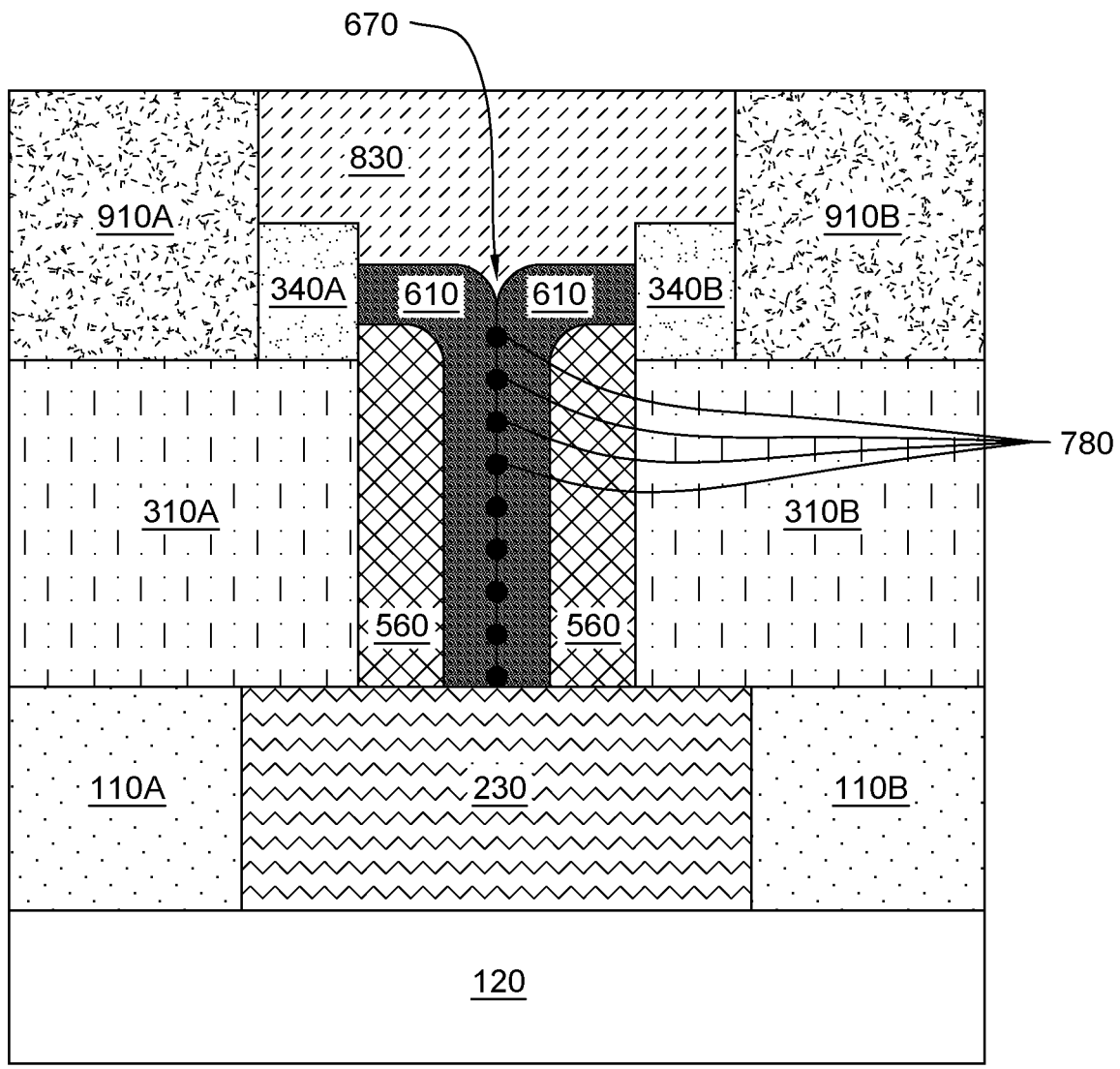
FIG. 12 illustrates a cross-sectional view of the structure depicted in FIG. 11 after subsequent processing steps in accordance with at least one embodiment of the present invention.

FIG. 12 illustrates a cross-sectional view of the structure as depicted in FIG. 11 after subsequent processing steps. Specifically, FIG. 12 depicts dielectric layer 910A and dielectric layer 910B formed on top of a portion of dielectric layers 310A and 310B, respectively. As depicted in FIG. 12, top electrode 830 abuts the right and left sides of dielectric layers 910A and 910B, respectively. In an embodiment, dielectric layers 910A and 910B are formed by removing a portion of 830, metallic layers 340A and 340B and forming (e.g., via chemical vapor deposition, atomic layer deposition, or any other suitable deposition techniques) dielectric layers 910A and 910B on top of second dielectric layers 310A and 310B and within the removed portions of metallic layers 340A and 340B. In an embodiment, dielectric layers 910A and 910B can be, for example, a low-k dielectric or an oxide dielectric, such as silicon oxide. In an embodiment, dielectric layers 910A and 910B can be, for example, a nitride dielectric, such as silicon nitride. In an alternative embodiment, after forming filament along the same, any metallic material above the filament can be removed. In an embodiment, the optional metallic layers 340A and 340B (e.g., formed from TiN) can also be removed. Then, a dielectric material is deposited and patterned to form a via above the filament. A metallic material (e.g., W, Cu) can be deposited and polished to form top electrode 830.

Figure 13:
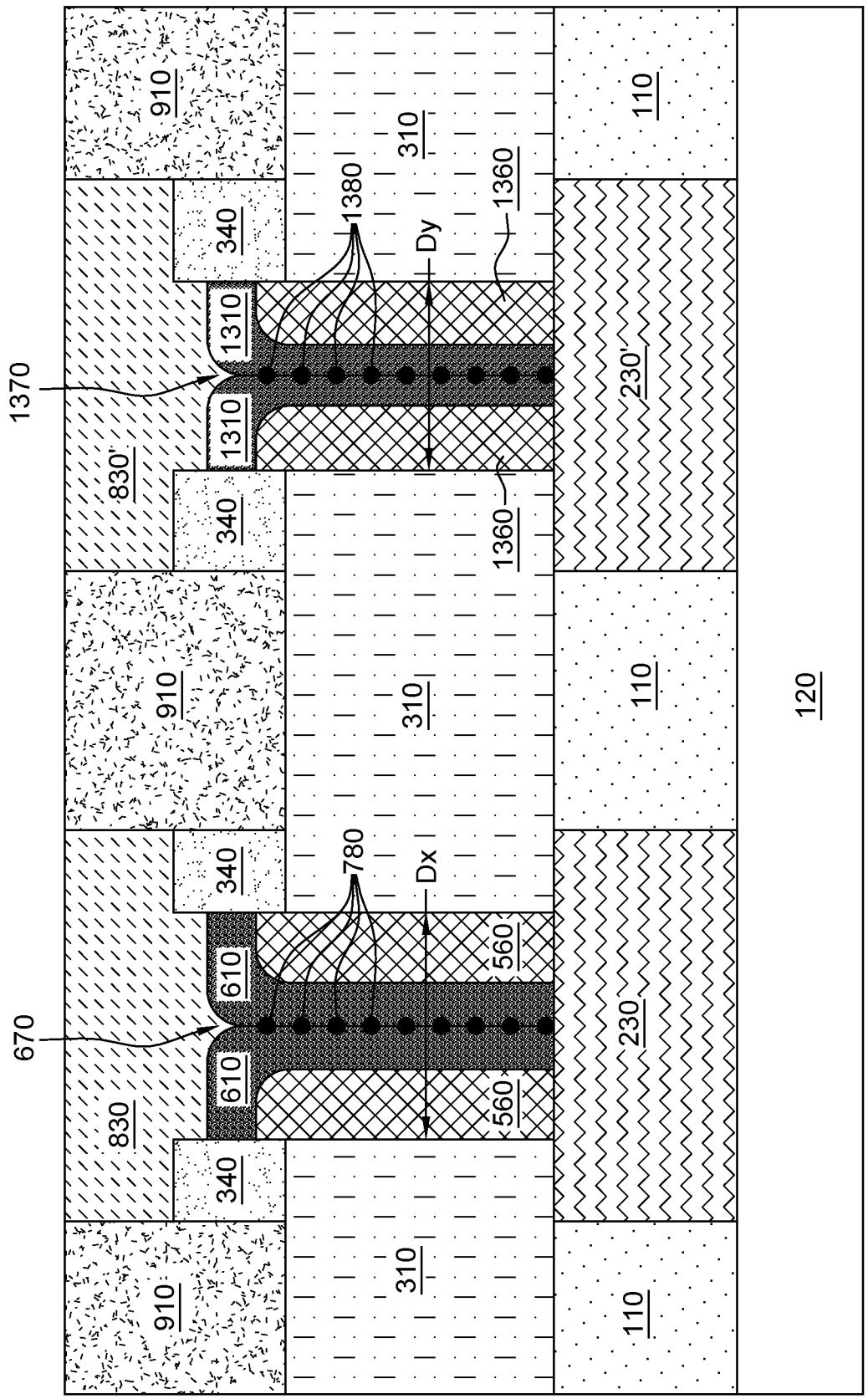
FIG. 13 illustrates a cross-sectional view of two memory cells having uniformly located seams within vias having differing diameters in accordance with at least one embodiment of the present invention.

FIG. 13 illustrates a cross-sectional view of two memory cells having uniformly located seams within vias having differing diameters in accordance with at least one embodiment of the present invention. Bottom electrode 230' is substantially similar to bottom electrode 230, and is formed in the same manner as bottom electrode 230 as described with reference to FIG. 2 above. Similarly, top electrode 830' is substantially similar to top electrode 830, and is formed in the same manner as top electrode 830 as described with reference to FIG. 11 above. Dielectric spacer 1360 formed within an initial via having a diameter ($D_y$) is substantially similar to dielectric spacer 560 formed within an initial via having a diameter ($D_x$), and is formed in the same manner as dielectric spacer 560 as described with reference to FIG. 6 above. Dielectric layer 1310 is formed on top of dielectric spacer 1360 in the same manner as dielectric layer 610 is formed on top of dielectric spacer 560 as described with reference to FIG. 8 above. Conductive filament 1380 is substantially similar to conductive filament 780, and is formed within seam 1370 in the same manner as conductive filament 780 is formed within seam 670 as described with reference to FIG. 10 above.

It should be noted that although the initial via diameter ($D_x$) of the first memory cell is greater than the initial via diameter ($D_y$), and thus the thickness of dielectric layer 610 being greater than dielectric layer 1310 in order to pinch-off the respective vias, seams 670 and 1370 are uniformly located between bottom and top electrodes 230 and 830, and bottom and top electrodes 230' and 830', respectively. This stems from the fact that as long as the pinch off dielectric thickness of dielectric layer 610 and dielectric layer 1310 selectively deposited onto dielectric spacers 560 and 1360, respectively, is equal to and/or greater than half of the diameters ($D_x$) and ($D_y$) of the initial vias, the location of seams 670 and 1370 will remain uniform irrespective of the diameters of the initial vias. In other words, since the position of seams 670 and 1370 is determined by the pinch-off point of dielectric layers 610 and 1310, respectively, the memory cells are immune to any patterning variations with respect to formation of a conductive bridge formed between a top and bottom electrode of the memory cell.

According to one embodiment of the present invention, a method of forming a memory cell is provided, the method comprising: forming a seam in a via that is directly connected to a bottom electrode based on pinching off the via, wherein pinching off the via includes selectively depositing a dielectric material on top of a dielectric spacer formed within the via.

In an embodiment, the seam is centrally located between the dielectric spacer.

In an embodiment, the dielectric material selectively deposited on top of the dielectric spacer conforms to an etch profile of the dielectric spacer.

In an embodiment, the method further comprises forming a conductive filament within the seam, wherein the conductive filament is in direct contact with the top surface of the bottom electrode. In an embodiment, the conductive filament within the seam is centrally located between the dielectric spacer. In an embodiment, the conductive filament formed within the seam is 1-dimensional. In an embodiment, the conductive filament is a metallic material.

In an embodiment, the method further comprises forming a top electrode on top of the conductive filament and the dielectric material. In an embodiment, the conductive filament forms a conductive bridge between the top surface of the bottom electrode and a bottom surface of the top electrode.

According to another embodiment of the present invention, a memory cell is provided, the memory cell comprising: a first dielectric material having a via; a dielectric spacer on a sidewall of the via; and a second dielectric material pinching off the via and forming a seam.

In an embodiment, the dielectric spacer is formed from silicon nitride.

In an embodiment, the second dielectric material is selectively deposited on top of the dielectric spacer. In an embodiment, the second dielectric material is aluminum dioxide.

In an embodiment, the memory cell further comprises a conductive filament within the seam. In an embodiment, the conductive filament formed within the seam is 1-dimensional. In an embodiment, the conductive filament within the seam is centrally located between the dielectric spacer.

In an embodiment, the memory cell further comprises a bottom electrode adjacent to the via, wherein a first end of conductive filament within the seam is in direct contact with the bottom electrode. In an embodiment, the memory cell further comprises a top electrode adjacent to the via, wherein a second end of the conductive filament within the seam is in direct contact with the top electrode.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as, for instance, "side", "over", "perpendicular", "tilted", etc., as used herein refer to relative location and orientation of various portions of the structures with respect to one another, and are not intended to suggest that any particular absolute orientation with respect to external objects is necessary or required.

The foregoing specification also describes processing steps. While some of the steps may be in an ordered sequence, others may in different embodiments from the order that they were detailed in the foregoing specification. The ordering of steps when it occurs is explicitly expressed, for instance, by such adjectives as, "ordered", "before", "after", "following", and others with similar meaning.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art.

What is claimed is:

1. A method of forming a memory cell, comprising:
    forming a seam in a via located on top of a bottom electrode based on pinching off the via, wherein pinching off the via includes selectively depositing a dielectric material on top of a dielectric spacer formed on a sidewall of the via, and further wherein pinching off the via results in the seam being in direct contact with the bottom electrode.

2. The method of claim 1, wherein the dielectric material selectively deposited on top of the dielectric spacer conforms to an etch profile of the dielectric spacer.

3. The method of claim 1, further comprising:
    forming a conductive filament within the seam, wherein the conductive filament is in direct contact with a top surface of the bottom electrode.

4. The method of claim 3, wherein the conductive filament within the seam is centrally located between the dielectric spacer.

5. The method of claim 3, wherein the conductive filament formed within the seam is 1-dimensional.

6. The method of claim 3, wherein the conductive filament is a metallic material.

7. The method of claim 3, further comprising:
    forming a top electrode on the conductive filament and the dielectric material.

8. The method of claim 7, wherein the conductive filament forms a conductive bridge between the top surface of the bottom electrode and a bottom surface of the top electrode.

9. The method of claim 1, wherein the seam is centrally located within the dielectric spacer.

10. A memory cell, comprising:
    a bottom electrode;
    a via formed within a first dielectric material and located on top of the bottom electrode;
    a dielectric spacer on a sidewall of the via; and
    a second dielectric material formed onto the dielectric spacer, the second dielectric material pinching off the via and forming a seam that is in direct contact with the bottom electrode.

11. The memory cell of claim 10, wherein the dielectric spacer is formed from silicon nitride.

12. The memory cell of claim 10, wherein the second dielectric material is selectively deposited on top of the dielectric spacer.

13. The memory cell of claim 10, wherein the second dielectric material is aluminum dioxide.

14. The memory cell of claim 11, further comprising:
    a conductive filament within the seam.

15. The memory cell of claim 14, wherein the conductive filament formed within the seam is 1-dimensional.

16. The memory cell of claim 14, wherein the conductive filament within the seam is centrally located between the dielectric spacer.

17. The memory cell of claim 14, further comprising:
    a top electrode adjacent to the via, wherein a second end of the conductive filament is in direct contact with the top electrode.

* * * * *